United States Patent [19]

Mitsui

[11] Patent Number: 5,333,081
[45] Date of Patent: Jul. 26, 1994

[54] MAGNETIC HEAD DRIVING CIRCUIT WITH DELAY ELEMENTS BETWEEN THE SWITCHING COMPONENTS

[75] Inventor: Kazuo Mitsui, Tokyo, Japan
[73] Assignee: NEC Corporation, Japan
[21] Appl. No.: 952,605
[22] Filed: Sep. 28, 1992
[30] Foreign Application Priority Data
Sep. 27, 1991 [JP] Japan .................. 3-248680
[51] Int. Cl.⁵ ............................. G11B 5/09; G11B 5/02
[52] U.S. Cl. ........................................ 360/46; 360/67; 360/68; 307/494
[58] Field of Search ............ 360/46, 59, 67, 68; 369/13; 307/454, 254, 255, 262, 494

[56] References Cited

U.S. PATENT DOCUMENTS

| | | | |
|---|---|---|---|
| 3,618,119 | 11/1971 | Rodriguez | 360/46 |
| 4,795,916 | 1/1989 | Liron | 307/494 |
| 5,067,032 | 11/1991 | Ida | 360/68 |
| 5,121,369 | 6/1992 | Makansi | 369/13 |
| 5,132,852 | 7/1992 | Price, Jr. | 360/68 |

OTHER PUBLICATIONS

Predriver for "H" configured write driver for magnetic recording IBM Technical Disclosure Bulletin, vol. 23, No. 11, pp. 5167-5168.

*Primary Examiner*—Donald Hajec
*Assistant Examiner*—T. N. Forbus, Jr.
*Attorney, Agent, or Firm*—Laff, Whitesel, Conte & Saret

[57] ABSTRACT

A magnetic head driving circuit is provided which has first and second transistors having the bases respectively connected to first and second input terminals and the collectors supplied with a power source voltage, third and fourth transistors having the collectors respectively connected to the emitters of the first and second transistors, and a magnetic head and surge absorbing resistor disposed in a parallel connection with each other between the emitters of the first and second transistors. Delay circuits are respectively disposed between the input terminal and the base of the fourth transistor and between the second input terminal and the base of the third transistor. If there has a time delay in inverting action generated between the first and second transistors, the reverse bias voltage acting between the base and emitter of the first and/or second transistor will be impossible to be increased, so that the switching time of the magnetic head current can be shortened. The magnetic recording density can also be improved.

6 Claims, 2 Drawing Sheets

MAGNETIC HEAD DRIVING CIRCUIT WITH DELAY ELEMENTS BETWEEN THE SWITCHING COMPONENTS

BACKGROUND OF THE INVENTION

1. Field of the Invention

This invention relates to a circuit for driving a magnetic head of a magnetic recording apparatus.

2. Description of the Related Art

A magnetic head driving circuit generally comprises two sets of transistor-pair for switching a magnetic head according to an input signal and a resistor element for absorbing a surge voltage. A conventional magnetic head driving circuit is shown in FIG. 1.

In the circuit diagram shown in FIG. 1, the collector of a first NPN transistor Q1 and the collector of a second NPN transistor Q2 are connected in common and respectively supplied with a power source voltage Vcc. The emitter of the first transistor Q1 is connected to the collector of a third NPN transistor Q3 and the emitter of the second transistor Q2 is connected to the collector of a fourth NPN transistor Q4. A magnetic head 3 is connected between a connecting point a of the first transistor Q1 and third transistor Q3 and a connecting point b of the second transistor Q2 and fourth transistor Q4. A surge voltage absorbing resistor 4 is connected parallel to the magnetic head 3. The emitter of the third transistor Q3 and that of the fourth transistor Q4 are connected in common to a constant current source 5. Thus, the magnetic head driving circuit structured as above makes an H bridge circuit.

The first transistor Q1 has its base supplied with a first input signal VIN1, the second transistor Q2 has its base supplied with a first inverted input signal VIN1, the third transistor Q3 has its base supplied with a second inverted input signal VIN2 and the fourth transistor Q4 has its base supplied with a second input signal VIN2. As shown in FIG. 1, the first input signal VIN1 may take a low (L) level voltage of 3.5 V or a high (H) level voltage of 4.5 V. On the other hand, the second input signal VIN2 may take an L-level voltage of 1 V or an H-level voltage of 2 V.

With the conventional magnetic head driving circuit as shown above, when the first input signal VIN1 and second input signal VIN2 respectively are of the H-level voltage both, the first transistor Q1 and fourth transistor Q4 switch ON and both the second transistor Q2 and third transistor Q3 switch OFF, so that the magnetic head 3 has an electric current flowing from the connecting point a to the connecting point b (in the right direction of FIG. 1). On the other hand, when the first and second input signals VIN1 and VIN2 respectively are of the L-level voltage both, the second and third transistors Q2 and Q3 switch ON and both the first and fourth transistors Q1 and Q4 switch OFF, so that the magnetic head 3 has an electric current flowing from the connecting point b to the connecting point a (in the left direction of FIG. 1).

When the electric current is in the magnetic head 3, that is, a magnetic head current is inverted it flows in the direction from the right to the left or from the left to the right. The input signals VIN1 and VIN2 are simultaneously switched from the H-level to the L-level or from the L-level to the H-level. At the moment when the magnetic head current is inverted, a surge voltage is generated from the magnetic head 3, but this surge voltage is restricted by the surge voltage absorbing resistor 4 provided in parallel to the magnetic head 3, resulting in the protection of the magnetic head 3 from the surge voltage.

For example, when a constant current IE flowing into the constant electric current source 5 is 30 mA and a resistance value of the surge absorbing resistor 4 is 500 Ω, the voltage across the surge absorbing resistor 4 can be determined as follows;

$$30 \text{ mA} \times 500 = 1.5 \text{ V} \quad (1).$$

In addition, for example, when the magnetic head 3 has an inductance of 5 μH, its time constant can be determined as follows;

$$5 \text{ μH}/500 \text{ Ω} = 10 \text{ nsec} \quad (2).$$

As a result, the reverse bias voltage applied between the base and emitter of the first transistor Q1 has a peak value of about 1 V.

With the driving circuit shown above, considerations will be made below of a case such that at one moment of time, the first input signal VIN1 inputted to the base of the first transistor Q1 is of the H-level (4.5 V), the first inverted input signal VIN1 inputted to the base of the second transistor Q2 is of the L-level (3.5 V), the second inverted input signal VIN2 inputted to the base of the third transistor Q3 is of the L-level (1 V) and the second input signal VIN2 inputted to the base of the fourth transistor Q4 is of the H-level (2 V). At the next moment of time, both of the first and second input signals are simultaneously switched to the L-level. In this case, the magnetic head 3 has a current from the connecting point a toward the connecting point b, as already described above.

In this consideration, no problem arises insofar as the input signals VIN1 and VIN2 are completely and simultaneously switched to the L-level. However, for example, when the inversion of the first input signal VIN1 is delayed, even slightly, from that of the second input signal VIN2, the fourth transistor Q4 switches OFF and third transistor Q3 switches ON slightly before the first transistor Q1 switches OFF and second transistor Q2 becomes ON. As a result, the electric potential at the connecting point b will be increased. For example, the base voltage of the first transistor Q1 is 4.5 V, the voltage VBE between the base and emitter thereof is 0.7 V and the surge voltage at that time is 500 Ω×300 mA=1.5 V, the electric potential at the connecting point b becomes 5.3 V momentarily, as follows;

$$4.5 \text{ V} - 0.7 \text{ V} + 1.5 \text{ V} = 5.3 \text{ V} \quad (3).$$

At that time, however, the base voltage of the second transistor Q2 is still at the L-level, that is, at 3.5 V, so that the reverse bias voltage applied between the base and emitter of the second transistor Q2 can be increased to above 2 V as calculated below.

$$5.3 \text{ V} - 3.5 \text{ V} = 1.8 \text{ V} \doteq 2 \text{ V} \quad (4).$$

However, accompanied with a recent trend toward making high density and high speed integrated circuits, the withstand voltage of transistors has a tendency to be reduced. Referring to the reverse bias withstand voltage between the base and emitter, it is about 5 V conventionally, but, recently it has been reduced to about 1.5 V. Considered from this point of view, in the conventional magnetic head driving circuit shown above, if a time delay occurs in inverting the input signals VIN1 and VIN2, such a problem will arise because an electric property (for example, current amplification factor) is degraded.

In addition, even if an attempt is made to shorter the switching time of the magnetic head current by further increasing the resistance value of the surge absorbing resistor 4, it cannot be realized because there is no conservative reverse bias withstand voltage between the base and emitter of the second transistor Q2.

Thus, object of this invention is to provide a magnetic head driving circuit in which even if a time delay occurs in converting the input signals of transistors, these transistors can be protected from the reverse bias voltages, and the switching time of a current flowing into the magnetic head can be decreased.

SUMMARY OF THE INVENTION

In a first aspect of this invention, a magnetic head driving circuit comprises a first transistor having the base connected to a first input terminal and the collector supplied with a power source voltage, a second transistor having the base connected to a second input terminal and the collector supplied with the power source voltage, a third transistor having the collector connected to the emitter of the first transistor, a fourth transistor having the collector connected to the emitter of the second transistor, a constant current source connected commonly to the emitter of the third transistor and the emitter of the fourth transistor, a magnetic head connected between the emitter of the first transistor and the emitter of the second transistor, a surge absorbing resistor connected to the magnetic head in parallel, a first delay circuit connected between the first input terminal and the base of the fourth transistor, and a second delay circuit connected between the second input terminal and the base of the third transistor.

A first input signal supplied from the first input terminal is sent directly to the base of the first transistor and through the first delay circuit indirectly to the base of the fourth transistor. Similarly, a second input signal supplied from the second input terminal is sent directly to the base of the second transistor and through the second delay circuit indirectly to the base of the third transistor. As a result, the inverting action of the fourth transistor is delayed in time from that of the first transistor. Similarly, the inverting action of the third transistor is delayed in time from that of the second transistor. Accordingly, in event that these four transistors all are inverted and the surge voltage is generated from the magnetic head, the first and second transistors have been already completed the inverting action or, even if not completed yet, the base voltage of the first and second transistors are sufficiently increased when to be inverted from the L-level to the H-level and sufficiently decreased when to be inverted from the H-level to the L-level.

As a result, even if there has been a time delay in the inverting action generated between the first and second transistors, the reverse bias voltage acting between the base and emitter of the first and/or second transistor will not be be increased, so that even if a high surge voltage occurs between the both ends of the magnetic head by increasing the resistance value of the surge absorbing resistor, the reverse bias voltage applied across the emitter and base of the first or second transistor is suppressed below the withstand voltage thereof.

Consequently, the switching or inverting time of the magnetic head driving circuit can be shortened, largely contributing the improvement of the magnetic recording density.

In the magnetic head driving circuit, it is preferably that each of the delay circuits comprises a fifth transistor, a diode and a resistor connected in series. When the direct-current level of the first and second input signals are different from each other, a delay circuit having a level shifting action additionally is preferably used.

In a second aspect of this invention, a magnetic head driving circuit is provided in which first and second amplifies are introduced instead of the first and second delay circuits in the first aspect and in which only one input terminal is used. That is, the magnetic head driving circuit of this aspect comprises a first transistor having its collector supplied with a power source voltage, a second transistor having the collector supplied with its power source voltage, a third transistor having its collector connected to its emitter of the first transistor, a fourth transistor having the collector connected to the emitter of the second transistor, a constant current source connected commonly to the emitter of the third transistor and the emitter of the fourth transistor, a magnetic head connected between the emitter of the first transistor and the emitter of the second transistor, a surge absorbing resistor connected to the magnetic head in parallel, a first amplifier connected between the base of the first transistor and the base of the second transistor and receiving an input signal, and a second amplifier connected between the base of the third transistor and the base of the fourth transistor and receiving an output signal of the first amplifier.

In the magnetic head driving circuit of this aspect, the input signal is amplified by the first amplifier and sent to the bases of the first and second transistors as well as being sent to the second amplifier. The input signal amplified again by the second amplifier is sent to the bases of the third and fourth transistors. As a result, the third and fourth transistors are delayed in inverting time by the time required for the amplification in the second amplifier from the first and second transistors. Besides, the signal applied to the bases of the third and fourth transistors is always larger in amplitude than the signal applied to the bases of the first and second transistors, so that when these four transistors all are inverted and the surge voltage is generated from the magnetic head, the inverting operations of the first and second transistors have been already completed or, even if not completed yet, the base voltages of the first and second transistors are sufficiently increased when inverted from the L-level to the H-level and sufficiently decreased when inverted from the H-level to the L-level.

Accordingly, in this aspect, the magnetic head driving circuit has the same effects as in the first aspect.

The first and second amplifiers are not specifically limited in kind and structure, so that almost any amplifier can be employed for this purpose if the first amplifier has one input terminal and three output terminals and the second amplifier has one input terminal and two output terminals.

DESCRIPTION OF THE PREFERRED EMBODIMENTS

Preferred embodiments of this invention will be described below while referring to FIGS. 2 to 4.

FIRST EMBODIMENT

Figure 2:
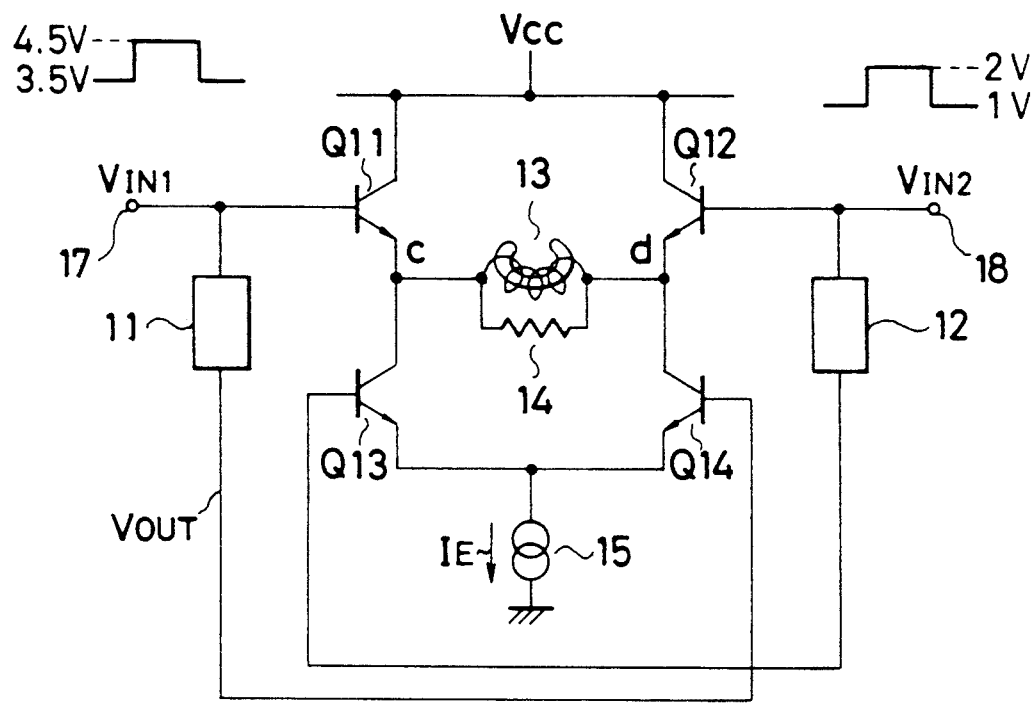
FIG. 2 is a circuit diagram of a magnetic head driving circuit according to a first embodiment of this invention.

FIG. 2 shows a magnetic head driving circuit of a first embodiment of this invention. In FIG. 2, the collector of a first NPN transistor Q11 and the collector of a second NPN transistor Q12 are connected in common to be supplied with a power source voltage Vcc. The emitter of the first transistor Q11 is connected to the collector of a third NPN transistor Q13 and the emitter of the second transistor Q12 is connected to the collector of a fourth NPN transistor Q14. A magnetic head 13 is connected between a connecting point c of the first and third transistors Q11 and Q13 and a connecting point d of the second and fourth transistors Q12 and Q14. The magnetic head 13 is, in turn, connected in parallel with a surge absorbing resistor 14. The emitter of the third and fourth transistors Q13 and Q14 are connected in common to a constant current source 15. The magnetic head driving circuit structured as above makes an H bridge circuit.

Between a first input terminal 17 and the base of the fourth NPN transistor Q4, a first delay circuit 11 additionally having a level shifting action is disposed between a second input terminal 18 and the base of the third NPN transistor Q13, a second delay circuit 12 additionally having the level shifting action is disposed.

Figure 3:
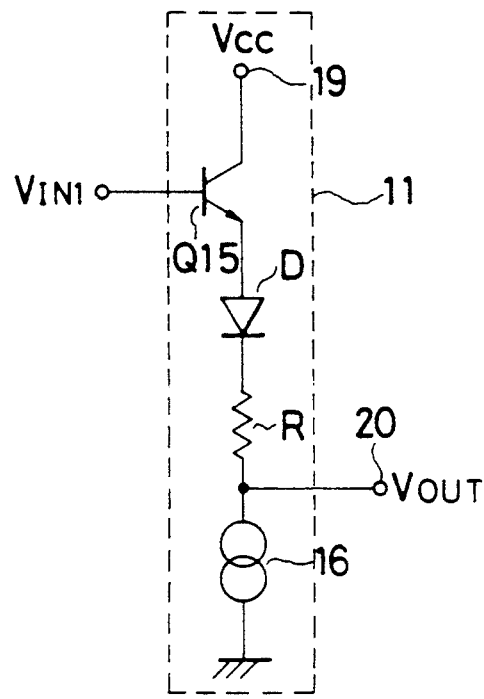
FIG. 3 is a circuit diagram of an example of a delay circuit to be used in the magnetic head driving circuit shown in FIG. 2.

The first delay circuit 11 has a structure as shown in FIG. 3, comprising a NPN transistor Q15, a diode D and a resistor R connected in series. The transistor Q15 has its collector supplied with the source voltage Vcc from a terminal power source 19 and the emitter connected to the anode of the diode D. The diode D has its cathode connected to one end of the resistor R. The other end of the resistor R is connected to a constant current source 16. The first delay circuit 11 is supplied through the base of the transistor Q15 with a first input signal VIN1. Its output is taken signal from an output terminal 20 to be sent to the base of the fourth transistor Q14. The second delay circuit 12 has the same structure as that of the first delay circuit 11.

As shown in FIG. 3, the delay circuit of this embodiment is simple in structure and easy to obtain the optimum level shifting action by controlling the resistance value of the resistor R.

The first input signal VIN1 is inputted to the base of the first transistor 11 and to the base of the fourth transistor Q4 with a slight delay of time. Similarly, a second input signal VIN2 is inputted to the base of the second transistor Q2 and to the base of the third transistor Q3 with a slight delay of time. The first input signal VIN1 takes a low (L) level voltage of 3.5 V or a high (H) level voltage of 4.5 V,. The second input signal VIN2 takes an L-level voltage of 1 V or an H-level voltage of 2 V. These input signals have the same L- and H-level voltages as those of the conventional circuit.

Figure 1:
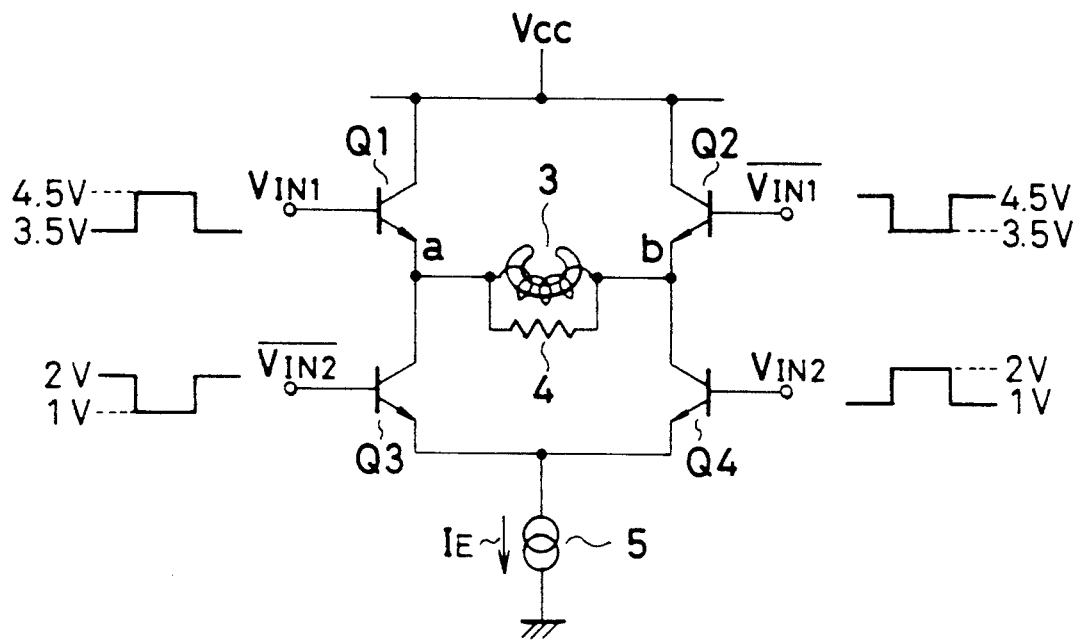
FIG. 1 is a circuit diagram of a conventional magnetic head driving circuit.

Besides, as the conventional magnetic head driving circuit shown in FIG. 1, when both the first and second input signals VIN1 and VIN2 are of the H-level, the magnetic head 13 has an electric current flowing from the connecting point c toward the connecting point d (in the right direction of FIG. 2). Inversely, when the first and second input signals VIN1 and VIN2 are of the L-level, the magnetic head 13 has an electric current flowing from the connecting point d toward the connecting point c (in the left direction of FIG. 2). When the electric current flowing into the magnetic head 13, that is, a magnetic head current is inverted, its flow direction from the right to the left or from the left to the right, the first and second input signals VIN1 and VIN2 are simultaneously switched from the H-level to the L-level or from the L-level to the H-level. The surge voltage generated in the magnetic head 13 at the moment when the magnetic head current is inverted can be restricted by the surge absorbing resistor 14, thus being capable of protecting the magnetic head 13 from the surge voltage.

With the magnetic head driving circuit structured as above, the first and second transistors Q11 and Q12 are switched first. Then the third and fourth transistors Q13 and Q14 are switched with a slight delay. As a result, for example, in event that the inversion of the input signal VIN1 is slightly delayed from the inversion of the input signal VIN2, if the surge voltage is generated in the magnetic head 13, the inverting operations of the first and second transistors Q11 and Q12 have been already completed or, even if not completed yet, the base voltage of the transistor Q12 is made sufficiently high with respect to the base voltage of the transistor Q11. Accordingly, even if the surge voltage of the magnetic head 13 is increased, the reverse bias voltage applied between the emitter and base of the transistor Q11 can be suppressed below the withstand voltage, thus being capable of increasing the resistance value of the surge absorbing resistor 14 than conventional. Consequently, the switching time of the magnetic head 13 can be shortened, resulting in an improvement in magnetic recording density.

In this embodiment, when the magnetic head 13 has an inductance of 5 $\mu$H and the surge absorbing resistor 4 has a resistance value of 1 K$\Omega$, the switching time of the current when the magnetic head 13 is inverted can be calculated as follows;

$$5 \mu H/1 k\Omega = 5 \text{ nsec} \tag{5}$$

This switching time is equal to a half of that of the conventional one.

SECOND EMBODIMENT

Figure 4:
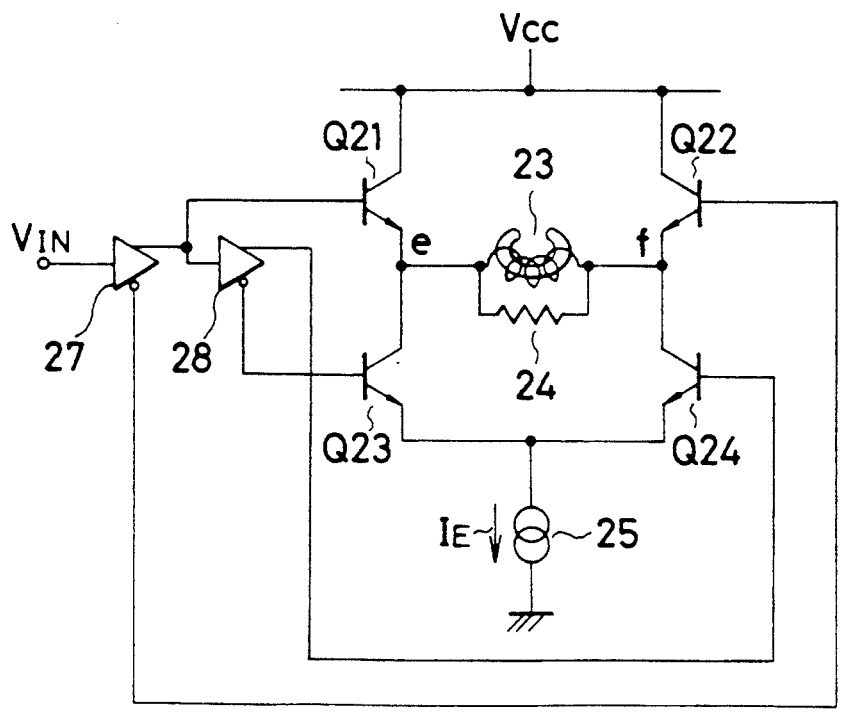
FIG. 4 is a circuit diagram of a magnetic head driving circuit according to a second embodiment of this invention.

FIG. 4 shows a second embodiment of this invention, in which two amplifiers 27 and 28 are introduced instead of the delay circuits 11 and 12 used in the first embodiment and yet only one input terminal VIN is used and other structures are substantially similar to those of the first embodiment.

A first NPN transistor Q21 and a second NPN transistor Q22 respectively have their collectors connected in common, which are supplied with a power source voltage Vcc therefrom. The emitter of the first transistor Q21 and the emitter of the second transistor Q22 are connected respectively to the collector of a third NPN transistor Q23 and the collector of a fourth NPN transistor Q24. A magnetic head 23 is connected between a connecting point e of the first and third transistor Q21 and Q23 and a connecting point f of the second and fourth transistors Q22 and Q24. Besides, the magnetic head 23 is connected in parallel with a surge absorbing resistor 24. The emitters of the third transistor Q23 and the fourth transistor Q24 are connected in common to a constant current source 25. The magnetic head driving circuit structured as above makes an H bridge circuit.

The first amplifier 27 is disposed between the bases of the first transistor Q21 and the second transistor Q22. The first amplifier 27 is supplied with an input signal VIN from an input terminal. The second amplifier 28 is disposed between the bases of the third transistor Q31 and the fourth transistor Q24. The second amplifier 28 is supplied with an output signal from the first amplifier 27. The output signal of the first amplifier 27 is supplied to the base of the first transistor Q21 and the second amplifier 28. An inverted output signal of the first amplifier 27 is supplied to the base of the second transistor Q22. On the other hand, an inverted output signal of the second amplifier 28 is supplied to the base of the third transistor Q23. An output signal of the second amplifier 28 is supplied to the base of the fourth transistor Q24.

In the magnetic head driving circuit structured as above, as a result, the inverting action of the third and fourth transistors Q23 and Q24 will be delayed by the time required for the amplification operation in the second amplifier 28 from the inverting action of the first and second transistors Q21 and Q22. The signal applied to the bases of the third and fourth transistors Q23 and Q24 is always larger in amplitude than the input signal VIN applied to the bases of the first and second transistors Q21 and Q22, so that when these four transistors all are inverted and the surge voltage is generated from the magnetic head 23, the inverting actions of the first and second transistors Q21 and Q22 have been already completed or, even if not completed yet, the base voltage of the first and second transistors Q21 and Q22 are sufficiently increased when inverted from the L-level to the H-level and sufficiently decreased when inverted from the H-level to the L-level.

Accordingly, in this embodiment, the same effects as those of the first embodiment can be obtained. In addition, by changing the amplification factor of both amplifiers 27 and 28, the difference between the level of a voltage supplied to the first and second transistors Q21 and Q22 and the level of a voltage supplied to the third and fourth transistors Q23 and Q24 can be advantageously and easily controlled. Further in addition, it is advantageous that only one input terminal may be employed.

The amplifiers 27 and 28 are not limited thereto and any other structured ones may be employed for this purpose.

What is claimed is:

1. A magnetic head driving circuit comprising:
   a first transistor having a base connected to a first input terminal and a collector supplied with a power source voltage;
   a second transistor having a base connected to a second input terminal and a collector supplied with said power source voltage;
   a third transistor having a collector connected to an emitter of said first transistor;
   a fourth transistor having a collector connected to an emitter of said second transistor;
   a constant current source connected commonly to the emitter of said third transistor and the emitter of said fourth transistor;
   a magnetic head connected between the emitter of said first transistor and the emitter of said second transistor;
   a surge absorbing resistor connected in parallel with said magnetic head;
   a first delay circuit connected between said first input terminal and the base of said fourth transistor; and
   a second delay circuit connected between said second input terminal and the base of said third transistor.

2. The magnetic head driving circuit as claimed in claim 1, wherein at least one of said first and second delay circuits comprises a fifth transistor, a diode and a resistor, said fifth transistor being an NPN transistor.

3. The magnetic head driving circuit as claimed in claim 1, wherein at least one of said first and second delay circuits has a voltage level shifting action.

4. The magnetic head driving circuit as claimed in claim 2, wherein at least one of said first and second delay circuits has a voltage level shifting action.

5. A magnetic head driving circuit comprising:
   a first transistor having a collector supplied with a power source voltage;
   a second transistor having a collector supplied with said power source voltage;
   a third transistor having a collector connected to an emitter of said first transistor;
   a fourth transistor having a collector connected to an emitter of said second transistor;
   a constant current source connected commonly to an emitter of said third transistor and an emitter of said fourth transistor;
   a magnetic head connected between the emitter of said first transistor and the emitter of said second transistor;
   a surge absorbing resistor connected to said magnetic head in parallel;
   a first amplifier connected between the base of said first transistor and the base of said second transistor and receiving an input signal; and
   a second amplifier connected between the base of said third transistor and the base of said fourth transistor and receiving an output signal of said first amplifier.

6. The magnetic head driving circuit as claimed in claim 5, wherein said first amplifier sends an output signal thereof directly to the base of one of said first and second transistors and sends a signal obtained by inverting the polarity of the output signal to the base of the other of said first and second transistors and, said second amplifier sends an output signal thereof directly to the base of one of said third and fourth transistors and sends a signal obtained by inverting the polarity of the output signal to the base of the other of said third and fourth transistors.

* * * * *